: US 6,787,799 B2
(45) Date of Patent: Sep. 7, 2004

(12) United States Patent
Asam et al.

(54) DEVICE AND METHOD FOR DETECTING A RELIABILITY OF INTEGRATED SEMICONDUCTOR COMPONENTS AT HIGH TEMPERATURES

(75) Inventors: Wilhelm Asam, München (DE); Josef Fazekas, München (DE); Andreas Martin, München (DE); David Smeets, München (DE); Jochen Von Hagen, Kolbermoor (DE)

(73) Assignee: Infineon Technologies AG, Munich (DE)

( * ) Notice: Subject to any disclaimer, the term of this patent is extended or adjusted under 35 U.S.C. 154(b) by 117 days.

(21) Appl. No.: 10/200,934

(22) Filed: Jul. 23, 2002

(65) Prior Publication Data

US 2003/0020131 A1 Jan. 30, 2003

(30) Foreign Application Priority Data

Jul. 23, 2001 (DE) .......................................... 101 35 805

(51) Int. Cl.$^7$ ............................................. H01L 23/58
(52) U.S. Cl. .................... 257/48; 257/467; 257/797; 438/18; 324/765; 324/252
(58) Field of Search ...................... 257/467, 48, 797, 257/E21.521; 73/777; 324/765–769, 158, 252; 374/178, 183–185; D10/77; 438/18

(56) References Cited

U.S. PATENT DOCUMENTS

| 4,356,379 A | | 10/1982 | Graeme ....................... 219/209 |
| 5,195,827 A | * | 3/1993 | Audy et al. .................. 374/172 |
| 5,280,237 A | * | 1/1994 | Buks ......................... 324/158.1 |
| 5,309,090 A | * | 5/1994 | Lipp ......................... 324/158.1 |
| 5,406,212 A | | 4/1995 | Hashinaga et al. |
| 5,414,370 A | | 5/1995 | Hashinaga et al. ......... 324/760 |
| 5,436,494 A | | 7/1995 | Moslehi |
| 5,751,015 A | | 5/1998 | Corbett et al. |

FOREIGN PATENT DOCUMENTS

DE         198 41 202 C1      3/2000

OTHER PUBLICATIONS

Meijer, G.: "Thermal Sensor Based on Transistors", Elsevier Sequoia, 1986, pp. 103–125.
Shideler, J. et al.: "A Systematic Approach to Wafer Level Reliability", Solid State Technology, Mar. 1995, pp. 47, 48, 50, 52, 54.
Anonymous: "Method to Determine Substrate Potential and Chip Temperature", *Research Disclosure*, Mar. 1990, No. 311, New York, XP–000104454.
R.A. Bianchi et al.: "CMOS–compatible temperature sensor with digital output for wide temperature range applications", *Microelectronics Journal*, No. 31, 2000, pp. 803–810.

* cited by examiner

Primary Examiner—Nathan J. Flynn
Assistant Examiner—Scott R. Wilson
(74) Attorney, Agent, or Firm—Laurence A. Greenberg; Werner H. Stemer; Ralph E. Locher

(57) ABSTRACT

The invention relates to a device and a method for detecting the reliability of integrated semiconductor components. The device includes a carrier substrate for receiving an integrated semiconductor component that will be examined, a heating element, and a temperature sensor. The temperature sensor has at least a portion of a parasitic functional element of the semiconductor component. As a result, reliability tests can be carried out in a particularly accurate and space-saving manner.

9 Claims, 4 Drawing Sheets

DEVICE AND METHOD FOR DETECTING A RELIABILITY OF INTEGRATED SEMICONDUCTOR COMPONENTS AT HIGH TEMPERATURES

BACKGROUND OF THE INVENTION

Field of the Invention

The present invention relates to a device and a method for detecting the reliability of integrated semiconductor components at high temperatures, and in particular, relates to highly accelerated tests for determining the reliability of semiconductor circuits.

A high reliability, in particular in the case of integrated semiconductor circuits, but also in thin-film technology, represents a significant factor in production and later use. Therefore, a multiplicity of tests are carried out during fabrication in order to be able to give as accurate a statement as possible with regard to the quality of a respective product, and also with regard to a respective fabrication process.

Since the structure width in semiconductor circuits is increasingly being reduced with advancing integration density, corresponding structures in large scale integrated circuits are loaded with very high current densities and/or temperatures during operation. In the case of such high current densities and temperatures, a multiplicity of mechanisms can lead to the failure of a respective semiconductor component and thus of the semiconductor circuit.

Such mechanisms are, for example, electromigration, giving rise to a material transport, in particular, in interconnects in the electron direction. Furthermore, instances of high current-density and temperature-dependent stressing can impair or destroy doping regions in a semiconductor substrate on account of barrier degradation or eutectic metal penetration. On the other hand, in field-effect transistor structures, such instances of stressing can also alter the properties of the so-called gate and/or tunnel oxides in a lasting manner, which again results in an adverse effect on the respective semiconductor components. The same applies to capacitances, inductances, memory elements, etc., formed in semiconductor substrates, in which, by way of example, passivation and intermediate dielectric layers can also be altered in a lasting manner by such current-density-, voltage- and/or temperature-dependent stressing and lead to the point of failure of the semiconductor component.

In order to be able to estimate a maximum lifetime of semiconductor circuits or thin-film circuits, a multiplicity of reliability tests are carried out, which preferably take place at elevated temperatures and current densities on specific test structures. These elevated temperatures were usually realized in special furnaces, whereby an accelerated artificial aging process can be brought about. However, since the fabrication of integrated semiconductor circuits, in particular, can last several weeks and checking for possibly defective structures is desired as early as during fabrication or immediately after completion, so-called accelerated and highly accelerated tests have been developed which enable the detection of a deviation in the fabrication in regular inspection measurements. In this case, these measurements must proceed in a range of seconds in order not to increase the fabrication time and thus the fabrication costs of respective semiconductor circuits.

FIG. 1 shows a device for detecting the reliability of integrated semiconductor components in accordance with the prior art, as is disclosed for example in the reference J. A. Scheideler, et al. "The Systematic Approach to Wafer Level Reliability", Solid State Technology, March 1995, page 47 et seq.

In accordance with FIG. 1, the MOS transistor, which is an integrated semiconductor component HBE that will be tested or stressed, is situated in a semiconductor substrate 1 that is $p^-$-doped, for example. The semiconductor component HBE is formed in an n-type well 2 of the semiconductor substrate 1 and essentially includes a $p^+$-doped drain region D, an associated contact K1, a $p^+$-doped source region S with an associated contact K2, a gate oxide layer 3 and a gate or a control layer G, which is situated above the gate oxide layer 3 and essentially defines a channel region lying between drain region D and source region S.

In order to check the quality and the process reliability, in the case of a large scale integrated circuit in accordance with FIG. 1, tests are carried out at temperatures above room temperature. Diverse models are used in order to characterize the degradation behavior, and a precise knowledge of the temperature is essential. Therefore, in accordance with FIG. 1, a local heating arrangement or a heating element HE is situated in an insulating layer 4 ($SiO_2$) in direct proximity to the semiconductor component HBE. Damage to the product on account of an external heating arrangement that is otherwise required can thereby be avoided.

In order to detect the temperature of the semiconductor component HBE to be stressed, in accordance with FIG. 1, there is a temperature sensor TS in the form of an aluminum meander that is spaced apart above the insulating layer 4. The linear relationship between the resistance and the temperature of the metal interconnect is evaluated.

What is disadvantageous, however, in the case of such a device for detecting the reliability of an integrated semiconductor component is that the distance between the structure that will be tested or the semiconductor component HBE and the temperature sensor or the aluminum meander TS is large and in between there lies one or a plurality of insulating intermediate layers 4 which constitute a large thermal resistance. As a result, a sufficiently accurate and direct statement with regard to the temperature present at the relevant region of the structure being tested or of the semiconductor component HBE is not possible. Furthermore, at higher temperatures, degradation of the aluminum or of the temperature sensor TS also occurs, for which reason, an exact and reproducible temperature determination is no longer possible after relatively long stress. As a further disadvantage of this conventional device, mention may be made of the extraordinarily high space requirement/contact area requirement, which essentially results from a 4-point resistance measurement and the pads required therefore.

Furthermore, the literature reference Gerard C. M. Mejer, "Thermal Sensors Based on Transistors", Sensors and Actuators, 10 (1986) 103–125 discloses utilizing the temperature dependence of a bipolar transistor or of its base-emitter voltage for realizing a temperature sensor.

Summary of the Invention

It is accordingly an object of the invention to provide an apparatus and a method for detecting the reliability of integrated semiconductor components which overcomes the above-mentioned disadvantages of the prior art apparatus and methods of this general type.

In particular, it is an object of the invention to provide an apparatus and a method for detecting the reliability of integrated semiconductor components which enables the temperature to be determined with an improved accuracy in conjunction with a reduced space requirement.

With the foregoing and other objects in view there is provided, in accordance with the invention, a device for detecting a reliability of an integrated semiconductor component. The device includes: a carrier substrate for receiving the integrated semiconductor component; a heating element for heating the semiconductor component; and a temperature sensor for detecting a temperature of the semiconductor component. The temperature sensor includes at least a portion of a parasitic functional element of the semiconductor component.

In accordance with an added feature of the invention, the parasitic functional element is a parasitic pn junction.

In accordance with an additional feature of the invention, the parasitic functional element is a parasitic bipolar transistor.

In accordance with another feature of the invention, the parasitic functional element may be a parasitic Schottky diode or a MOS diode.

In accordance with a further feature of the invention, the semiconductor component includes a resistor, a capacitance, an inductance, a diode, a field-effect transistor, a bipolar transistor and/or a thyristor.

In accordance with a further added feature of the invention, the heating element is buried in direct proximity to the semiconductor component in the carrier substrate.

In accordance with a further additional feature of the invention, an additional functional element is provided for completing the parasitic partial functional element.

In accordance with yet an added feature of the invention, the additional functional element includes at least one doping region and/or a connection.

In accordance with yet an additional feature of the invention, the semiconductor component has a region that is of relevance during testing, and the parasitic functional element lies in direct proximity to the region.

With the foregoing and other objects in view there is also provided, in accordance with the invention, a method for detecting a reliability of an integrated semiconductor component, which includes steps of: using a temperature sensor including at least a portion of a parasitic functional element of the semiconductor component to perform a measurement mode for measuring a temperature that is caused by a heating element and that is actually present at the semiconductor component; performing a stress mode for stressing the semiconductor component at least in a manner dependent on a temperature of the heating element; and evaluating a failure instant of the semiconductor component at least in a manner dependent on the temperature that is caused by the heating element.

In accordance with an added mode of the invention, during the stressing, an electrical parameter, which is a stress current density and/or a stress voltage, is altered in the semiconductor component; and during the evaluating, the electrical parameter is taken into account.

In accordance with an additional mode of the invention, during the measurement mode, a very small measurement current is impressed on the temperature sensor.

In accordance with a further mode of the invention, during the measurement mode, a temperature that is actually present at the semiconductor component is derived from an I/V characteristic curve of the parasitic functional element or a C/V characteristic curve of the parasitic functional element.

In accordance with a further added mode of the invention, the measurement mode and the stress mode are performed separately from each other with respect to time.

In accordance with a further additional mode of the invention, during the measurement mode, the heating element is calibrated; and during the stress mode, the semiconductor component is stressed in a manner dependent on the heating element that has been calibrated.

In accordance with yet an added mode of the invention, the measurement mode and the stress mode are performed at the same time.

In particular by virtue of using a temperature sensor which includes at least a portion of a parasitic functional element of the semiconductor component to be stressed, it is possible to significantly reduce the space requirement. Furthermore, the temperature sensor is shifted significantly closer to the actually relevant region of the semiconductor component that will be considered, as a result of which, the accuracy of the temperature measurement and thus the accuracy of the reliability test are significantly improved.

The parasitic functional element preferably includes a parasitic pn junction, a parasitic bipolar transistor and/or a parasitic Schottky or MOS diode of the semiconductor component. In this way, using a parasitic functional element that is usually undesired and present anyway, it is possible to examine a respective partial region of the semiconductor component to be examined in a highly accurate manner and in direct proximity to the stressing. In addition to a very exact temperature determination in relevant partial regions of the test structure or of the semiconductor component that is being stressed, in this case the functionality of the test structure or of the semiconductor component is not disturbed by the measurement sensor, and there is usually even a reduction in the number of connections required for the measurement.

In order to avoid damage to the product, such as on a semiconductor wafer, the heating element is preferably buried in direct proximity to the semiconductor component in the carrier substrate.

In order to improve the accuracy, an additional functional element may be provided for completing the parasitic partial functional element of the temperature sensor. Doping regions and/or connection regions are usually provided. In this way, with minimal additional outlay, it is possible to realize a further increase in the measurement accuracy, which results, in particular, from using bipolar transistors as temperature sensors.

In the circuitry, in this case a parasitic functional element is selected from the multiplicity of parasitic functional elements present in such a way that it is situated in direct proximity to a region that will be stressed or a critical region of the test structure or of the semiconductor component. In this way, different regions of complex semiconductor components can also be assessed with regard to their failure probability.

With regard to the method, a highly accurate statement about the reliability of the semiconductor component is obtained in particular on account of a measurement mode that is carried out, in which a parasitic functional element of the semiconductor component is driven as temperature sensor. In addition, a stress mode is carried out, in which the semiconductor component is stressed at least in a manner dependent on the temperature of the heating element.

Preferably, a stress current density is additionally applied to the semiconductor component and is taken into account, as a result of which it is also possible to realize current-density-dependent reliability tests.

The measurement current of the temperature sensor is very small in this case, for which reason the semiconductor component remains essentially uninfluenced.

The measurement mode and the stress mode are preferably carried out separately from one another with respect to time, thereby yielding an improved accuracy. However, they can also be carried out at the same time, during which the measurement accuracy is only impaired to an insignificant extent, but a so-called real-time measurement is made possible.

In order to realize a highly accurate reliability test, the measurement mode is separated from the stress mode with respect to time, in which case the heating element is calibrated in the measurement mode. During the subsequent stressing in the stress mode, the temperature sensor or the parasitic functional elements are not connected and the temperature is set only in a manner dependent on the calibrated heating element. An optimum reliability test is produced in this way.

Other features which are considered as characteristic for the invention are set forth in the appended claims.

Although the invention is illustrated and described herein as embodied in a Device And Method For Detecting A Reliability Of Integrated Semiconductor Components At High Temperatures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
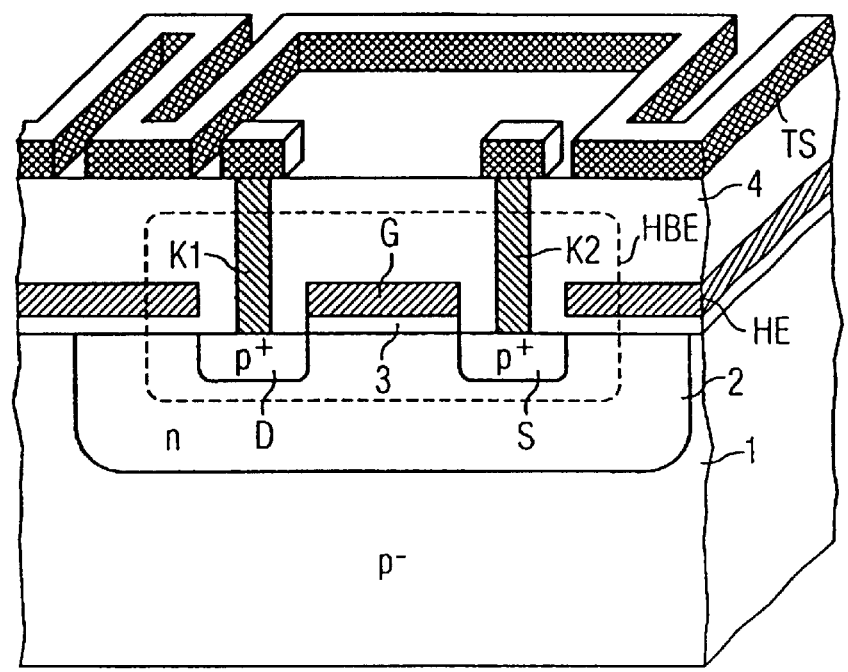
FIG. 1 is a simplified 3D sectional view of a conventional reliability test device.
Figure 2:
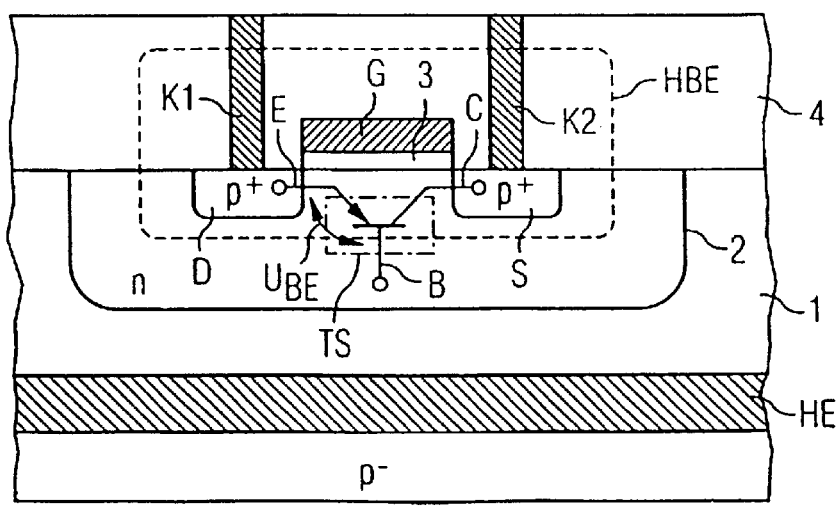
FIG. 2 is a simplified sectional view of a first exemplary embodiment of a reliability test device in a first measurement mode.

Referring now to the figures of the drawing in detail and first, particularly, to FIG. 2 thereof, there is shown a simplified sectional view of a first exemplary embodiment of a reliability test device In a first measurement mode. Identical reference symbols designate elements that are identical or that correspond to those in FIG. 1 and therefore, a repeated description is dispensed with below.

In accordance with FIG. 2, an embedded heating element layer HE, which constitutes, for example, a polysilicon resistor and the actual heating element, is situated in a p⁻-doped semiconductor substrate 1, preferably having silicon. In the case of such a heating arrangement HE arranged locally in direct proximity to a semiconductor component HBE that will be tested or stressed, the test structures can be heated in a targeted manner without damaging the semiconductor components that are formed on the semiconductor wafer on account of an external heating arrangement.

The semiconductor component HBE that will be considered or tested, in accordance with FIG. 2, again constitutes a MOS transistor having a drain region D, a source region S and a gate or a control layer G, which is spaced apart from the channel region by an insulation layer or gate oxide layer 3. For connecting the drain and source regions D and S, electrically conductive contacts K1 and K2 are provided which are connected to interconnects or metallization tracks (not specifically illustrated). The MOS transistor HBE illustrated in FIG. 2 is situated in an n-type well 2 formed in the semiconductor substrate 1. At the substrate surface, the control layer G is surrounded by one or a multiplicity of insulation layers or passivation layers 4. Although further connection contacts for the substrate 1, the control layer G and the n-type well 2 are not explicitly illustrated in the sectional view shown in FIG. 2, such contacts are usually formed at another point for the defined potential definition of the respective regions.

In contrast to the prior art shown in FIG. 1, the temperature sensor TS is now not configured in the form of an aluminum meander at the surface of the insulating layer 4, but rather is at least partially composed of parasitic functional elements of the semiconductor component HBE.

More precisely, the MOS transistor or the semiconductor component HBE considered has a multiplicity of parasitic functional elements such as e.g. pn junctions, parasitic bipolar transistors, Schottky diodes, MOS diodes, etc., which, however, are actually not desired and are usually not connected. According to the invention, these parasitic functional elements or parts thereof are now driven in such a way that they can be used as temperature sensors.

In accordance with FIG. 2, in a first measurement mode, a lateral parasitic bipolar transistor situated between the drain region D and the source region S and also the n-type well 2 can be utilized as a temperature sensor TS. The temperature can be determined for example by the temperature dependence of the collector current $I_C$ on a specific base-emitter voltage $V_{BE}$. In this case, the following holds true:

$$I_C = I_S * e^{(q/k \cdot T) \cdot V_{BE}},$$

where $I_S$ is a saturation current, k is Boltzmann's constant, q is the elementary charge and T is the absolute temperature that will be measured.

Since connections are usually available both for the n-type well 2 and for the drain and source regions D and S, a temperature sensor TS is obtained without any additional extra outlay and with a minimal space requirement. This temperature sensor is situated in direct proximity to a relevant region (e.g. channel region) of the semiconductor component HBE that will be stressed or tested. On account of this highly accurate temperature determination, it is possible to carry out highly accurate and highly accelerated reliability tests on semiconductor components HBE. Both temperature stressing and current-density stressing and voltage stressing can be evaluated in this way on the test structure.

Figure 3:
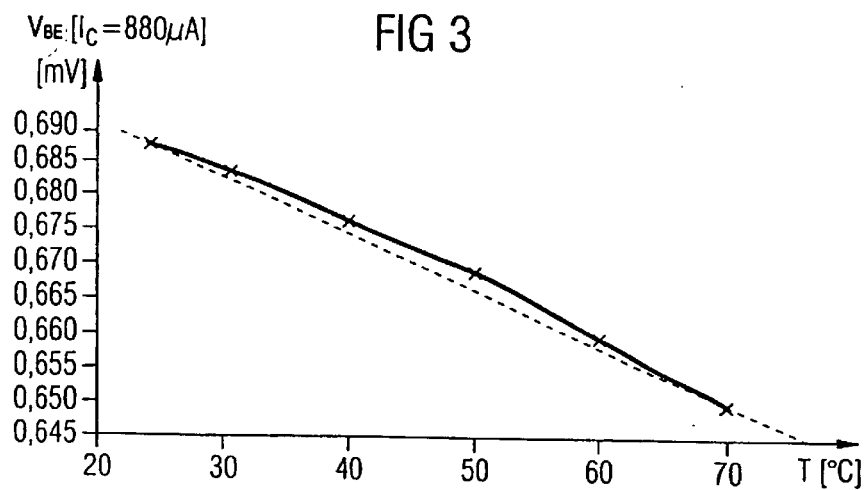
FIG. 3 is a graph of a base-emitter voltage of the temperature sensor shown in FIG. 2 as a function of a measured temperature.

FIG. 3 shows a graphical illustration of a base-emitter voltage $V_{BE}$ plotted against a temperature T that has been measured at the temperature sensor shown in FIG. 2. In this case, the parasitic lateral bipolar transistor is operated in a common base/collector circuit, and a very small constant collector current $I_C$=880 microamperes is impressed, for example. In the case of such small measurement currents less than 1 milliampere, the properties of the MOS transistor or of the semiconductor component HBE to be examined are hardly influenced, for which reason it is possible to carry out a measurement mode for carrying out a temperature measurement using the temperature sensor TS and a stress mode for carrying out stressing of the semiconductor component HBE at least in a manner dependent on the temperature of the heating element HE, not only separately with respect to time, but also at the same time.

In the stress mode in addition to stressing using the temperature of the heating element HE, it is also possible to apply a stress current density or a stress voltage to the semiconductor component HBE to be examined, thereby enabling particularly realistic tests. In the event of carrying out the measurement mode and the stress mode at the same time, it is thereby possible to further shorten the test time for execution in the case of highly accelerated reliability tests. On the other hand, in the event of carrying out the measurement mode and the stress mode separately with respect to time, and in short cycled that take place one after the other with respect to time (chopper operation), it is possible to provide a reliability test that has an improved accuracy. The time required in this case is lengthened only to an insignificant extent. In both cases, the failure instant of the semiconductor component that will be examined is evaluated in a manner dependent on at least the applied temperature or a stress current or voltage. In this way, the reliability of not only completed semiconductor circuits, but also of semiconductor components that are still being fabricated can be checked and compensatory intervention can be made in the further fabrication method.

In order to highly accurately detect the reliability of integrated semiconductor components, the measurement mode for measuring a temperature that is caused by the heating element HE and that is actually present at the semiconductor component HBE and the stress mode for carrying out stressing of the semiconductor component HBE are separated from one another with respect to time. The heating element is calibrated in the measurement mode. More precisely, first the temperature characteristic curve of the heating element HE is determined using the temperature sensor TS without carrying out current-density stressing, and then the actual stressing or the stress mode is carried out with the temperature sensor completely switched off. In this case, the temperature that is actually present at the semiconductor component is set exclusively by the heating element HE that has been calibrated in the measurement mode. In this way, it is possible to completely preclude an influence on the semiconductor component by an albeit very small measurement current, as a result of which it is possible to realize highly accurate reliability tests.

Figure 4:
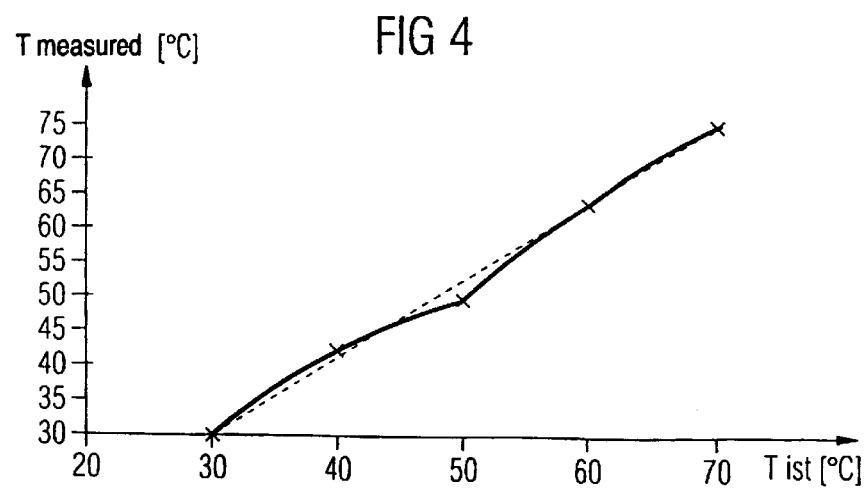
FIG. 4 is a graph of the temperature measured by the temperature sensor shown in FIG. 2 against a temperature that is actually present.

FIG. 4 shows a simplified graphical illustration between a temperature $T_{measured}$, measured at the temperature sensor in accordance with FIG. 2, and a temperature $T_{actual}$, actually applied using, for example, a so-called temperature chuck or a heatable holding device. Accordingly, the accuracy is extra-ordinarily high and there results only minimal deviations from an ideal (dashed) line.

Figure 5:
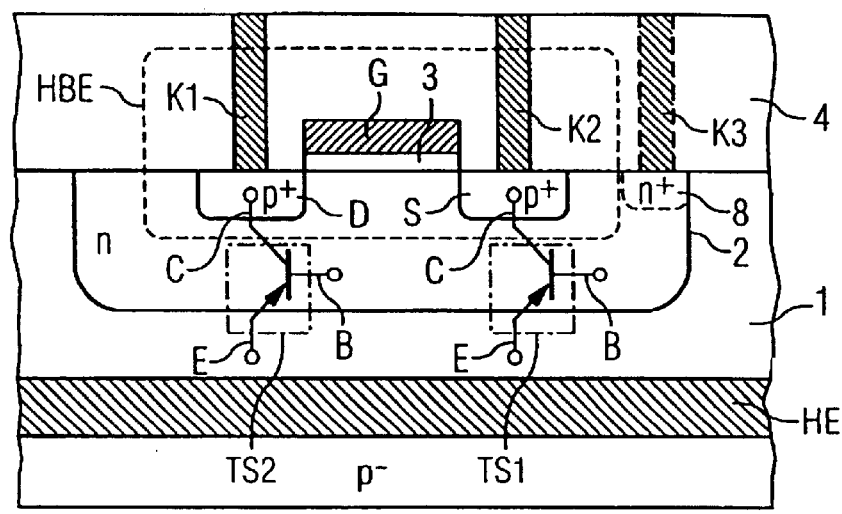
FIG. 5 is a simplified sectional view of the first exemplary embodiment of the reliability test device in a second measurement mode.

FIG. 5 shows a simplified sectional view of the first exemplary embodiment of the reliability test device in a second measurement mode. Identical reference symbols designate elements that are identical or that correspond to those in FIGS. 1 and 2, and a repeated description is dispensed with below.

In contrast to the measurement mode in accordance with FIG. 2, in the case of the measurement mode in accordance with FIG. 5, rather than the lateral parasitic bipolar transistor between the drain region D and the source region S, at least one vertical parasitic bipolar transistor between the drain region D and/or the source region S, the n-type well 2 and the semiconductor substrate 1 is used as the temperature sensor. Furthermore, FIG. 5 illustrates an additional connection region or contact K3 with an $n^+$-type diffusion region 8 that can optionally be added if such a connection is not directly available, is utilized for a different purpose, or is positioned unfavorably. Once again the parasitic vertical bipolar transistor or transistors TS1 and TS2 may, for example, be operated in, for example, a common base/collector circuit with an impressed collector current $I_C$ and the prevailing temperature may be derived from the base-emitter voltage $V_{BE}$. Upon consideration of both vertical transistors TS1 and TS2, it is possible to specify the following simple relationship, for example, by virtue of the difference formation in the equation described above:

$$V_{BE}(TS2)-V_{BE}(TS1)=K^*(T2-T1),$$

where K represents a proportionality constant and T1 and T2 represent the respective temperatures at the respective vertical transistors TS1 and TS2.

In particular in the case of complex test structures or semiconductor components HBE to be considered, partial regions of the semiconductor component can thus also be measured and evaluated in a highly accurate manner with regard to their temperature.

Figure 6:
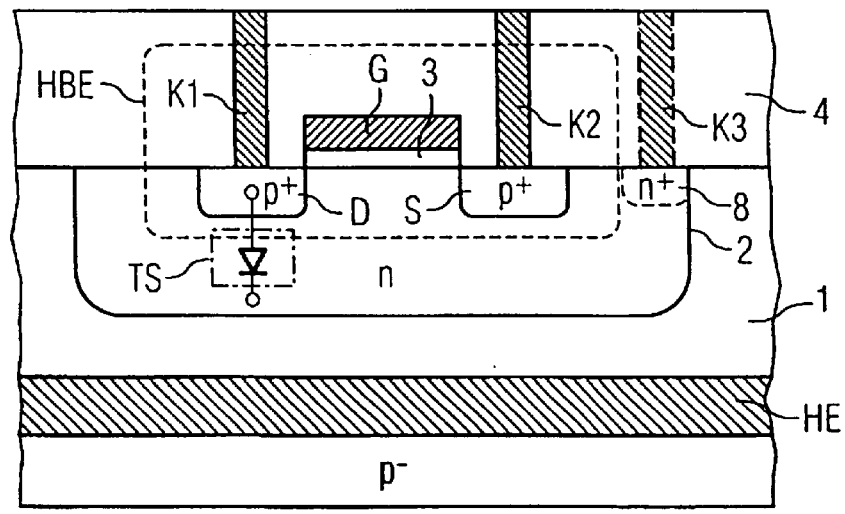
FIG. 6 is a simplified sectional view of the first exemplary embodiment of the reliability test device in a third measurement mode.

FIG. 6 shows a simplified sectional view of the first exemplary embodiment of the reliability test device in a third measurement mode. Identical reference symbols again represent elements that are identical or that correspond to those in FIGS. 1, 2 and 5 and a repeated description is, therefore dispensed with below.

In accordance with FIG. 6, by way of example, pn junctions in the form of diodes are used as temperature sensors TS in place of parasitic bipolar transistors. In FIG. 6, a parasitic diode TS situated between the drain region D and the n-type well 2 in this case serves for temperature determination. The temperature dependence of the diode current $I_D$ at an applied voltage $V_{pn}$ is evaluated using:

$I_D = I_S(\exp^{(q/k^*T)^*Vpn}-1)$. For $((q/k^*T)^*Vpn)>10$ it holds true that:

$$I_D = I_S^* \exp^{(q/k^*T)^*Vpn},$$

where $I_S$ represents the saturation current of the diode, T represents the absolute temperature, k represents Boltzmann's constant and $I_D$ represents the diode current.

A temperature sensor TS represented by a pn junction is not as accurate as the parasitic bipolar transistor described above, but is usually present as a parasitic functional element for each semiconductor component HBE. Once again the temperature sensor TS can be completed or optimized for example using an additional connection region K3.

Figure 7:
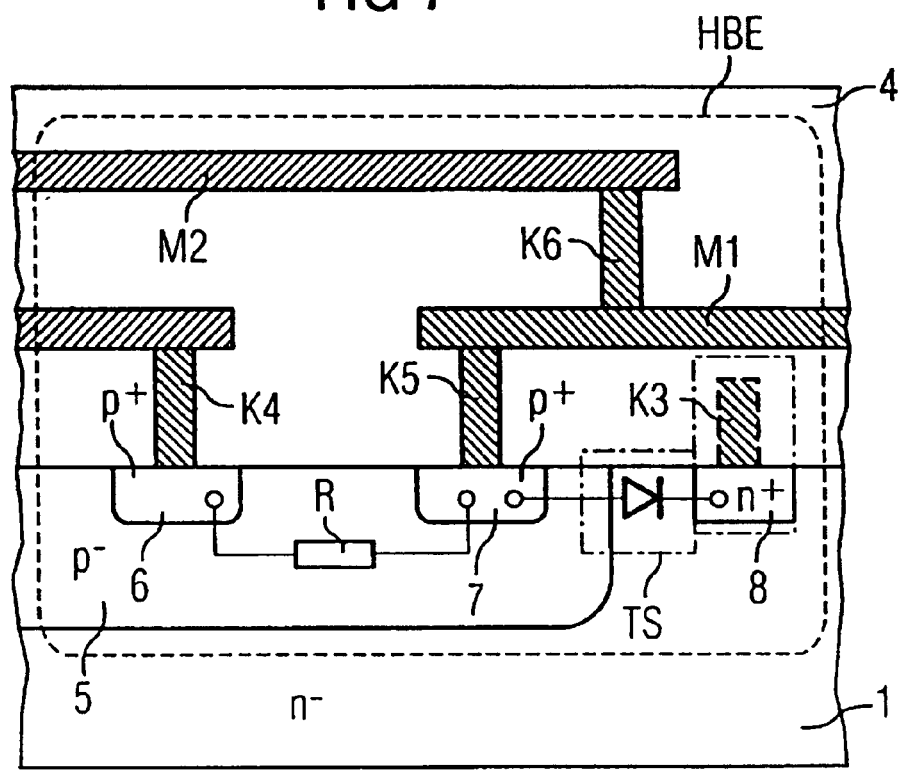
FIG. 7 is a simplified sectional view of a second exemplary embodiment of the reliability test device.

FIG. 7 shows a simplified sectional view of a second exemplary embodiment of a reliability test device. Identical reference symbols again represent elements that are identical or that correspond to those in FIGS. 1, 2, 5 and 6 and a repeated description is dispensed with below.

In contrast to the first exemplary embodiment in accordance with FIGS. 2 to 6, the semiconductor component HBE to be examined or the test structure now merely includes a resistor R which is connected to a metallization layer M1 and M2 in a semiconductor substrate 1 by a p⁻-doped region 5 and highly doped p⁺-type regions 6 and 7. In this case, the metallization layers or metallization planes M1 and M2 are connected to one another and to the integrated resistor R by contacts or "vias" K4, K5 and K6. In the case of such a structure that will be tested, what are of importance are not so much failure mechanisms in a channel region, but rather the failure mechanisms at the connection regions and also in the vias and metallization planes on account of electromigration, for example.

In accordance with FIG. 7, for example, by using an additional contact or via K3 and an associated diffusion region 8, which is n⁺-doped for example, a parasitic diode may be formed as a temperature sensor TS and can be used in the same way, as described above, for determining the temperature of the integrated resistor R. In principle, the additional diffusion region 8 and the additional connection K3 can also be omitted by using a substrate connection that is usually present, but that is not illustrated, for the semiconductor substrate 1.

In the same way, in order to increase an accuracy of the reliability test, it is also possible to add a further diffusion region (not illustrated) with a connection region, as a result of which, by way of example, a parasitic bipolar transistor structure is produced as a temperature sensor.

Once again a significant improvement in the reliability test device results on account of the improved temperature accuracy and on account of the reduced space requirement. A temperature that is actually present at the relevant region of the structure that will be stressed or tested or the semiconductor component HBE can thus be determined in a particularly simple and space-saving manner.

The invention has been described above using a MOS transistor and an integrated resistor. However, it is not restricted thereto and encompasses in the same way integrated capacitances with intermediate dielectrics, integrated inductances, integrated diodes, integrated field-effect transistors (including memory transistors), integrated bipolar transistors and/or integrated thyristors. Furthermore, in accordance with the above description, the heating element HE is buried in direct proximity to the semiconductor component HBE to be examined in the carrier substrate 1. However, it may also be situated at a different location in an integrated circuit or be designed as an external heating arrangement (temperature chuck).

Furthermore, essentially the I/V characteristic curves of diodes or transistors have been considered above as temperature characteristic curves. In the same way, however, it is possible to use C/V characteristic curves or other temperature-dependent characteristic curves for temperature determination. In particular Schottky diodes or MOS diodes are advantageous for determining temperatures in contact regions or of gate oxide regions. In the same way, besides silicon, alternative semiconductor materials and/or other materials are also conceivable as the carrier substrate.

The invention has been described above using a MOS semiconductor component and an integrated resistor. However, it is not restricted thereto and encompasses in the same way integrated capacitances, inductances, diodes, field-effect transistors, bipolar transistors and/or thyristors.

We claim:

1. A combination, comprising:
   a carrier substrate;
   a semiconductor component having a parasitic functional element, the semiconductor component being integrated in said carrier substrate;
   a heating element for heating the semiconductor component; and
   a temperature sensor for detecting a temperature of the semiconductor component, said temperature sensor formed in said substrate;
   said temperature sensor including at least a portion of said parasitic functional element of the semiconductor component.

2. The combination according to claim 1, wherein: said parasitic functional element is a parasitic pn junction.

3. The combination according to claim 1, wherein: said parasitic functional element is a parasitic bipolar transistor.

4. The combination according to claim 1, wherein: said parasitic functional element is a diode selected from a group consisting of a parasitic Schottky diode and a MOS diode.

5. The combination according to claim 1, wherein: the semiconductor component includes a component selected from a group consisting of a resistor, a capacitance, an inductance, a diode, a field-effect transistor, a bipolar transistor and a thyristor.

6. The combination according to claim 1, wherein: said heating element is buried in direct proximity to the semiconductor component in said carrier substrate.

7. The combination according to claim 1, comprising: an additional functional element for completing said parasitic partial functional element.

8. The combination according to claim 7, wherein: said additional functional element includes a component selected from a group consisting of at least one doping region and a connection.

9. The combination according to claim 1, wherein: the semiconductor component has a region that is of relevance during testing, and said parasitic functional element lies in direct proximity to said region.

* * * * *